United States Patent [19]

Hayakawa et al.

[11] Patent Number: 4,878,084

[45] Date of Patent: Oct. 31, 1989

[54] METHOD AND DEVICE FOR FEEDING SHEET IN IMAGE RECORDING APPARATUS

[75] Inventors: Kiyoharu Hayakawa, Ama; Yumio Matsumoto, Kasugai; Masashi Ueda, Nagoya; Akira Sago, Nagoya; Osamu Tagaki, Nagoya, all of Japan

[73] Assignee: Brother Kogyo Kabushiki Kaisha, Nagoya, Japan

[21] Appl. No.: 201,915

[22] Filed: Jun. 3, 1988

[30] Foreign Application Priority Data

Jun. 8, 1987 [JP] Japan .................................. 62-142552
Dec. 15, 1987 [JP] Japan .................................. 62-191017

[51] Int. Cl.⁴ ...................... G03B 27/32; G03B 27/52
[52] U.S. Cl. ...................................... 355/27; 354/301; 271/245; 271/265
[58] Field of Search ............... 354/301, 303, 304, 302; 355/27, 28; 430/138; 271/245, 265

[56] References Cited

U.S. PATENT DOCUMENTS

| | | | |
|---|---|---|---|
| 4,168,059 | 9/1979 | Potoczek et al. | 271/245 |
| 4,399,209 | 8/1983 | Sanders et al. | 430/138 |
| 4,714,943 | 12/1987 | Sakakibara et al. | 430/138 X |
| 4,770,972 | 9/1988 | Nelson et al. | 430/138 |
| 4,799,085 | 1/1989 | Nagumo et al. | 355/27 |

*Primary Examiner*—A. A. Mathews
*Attorney, Agent, or Firm*—Oliff & Berridge

[57] ABSTRACT

An image recording sheet, such as a developer sheet, is fed so as to overlap a light-exposed sheet, such as a photosensitive pressure-sensitive sheet which carries an image recorded thereon. The image is transferred from the exposed sheet to the image recording sheet at a pressure developing unit. The image recording sheet is delivered to cause a leading end thereof to abut the exposed sheet, while being fed into the developing unit at a position near an inlet of the developing unit for allowing the image recording sheet to move along and with the exposed sheet into the developing unit. A device for feeding an image recording sheet is an image recording apparatus, said image recording apparatus including an exposure unit for light-exposure to said sheet for forming the latent image, and a pressure developing unit disposed at downstream side of the exposed unit at which the light-exposed sheet and the image recording sheet are overlappingly pressed. The device for feeding comprises: a stop means for temporarily preventing the image recording sheet from feeding to the developing unit, and driving means for selectively allowing the image recording sheet to pass therethrough in response to movement of the light-exposed sheet.

6 Claims, 10 Drawing Sheets

METHOD AND DEVICE FOR FEEDING SHEET IN IMAGE RECORDING APPARATUS

BACKGROUND OF THE INVENTION

The present invention relates to a method and a device for feeding a sheet such as a developer sheet so as to overlap another sheet such as an exposed photosensitive pressure-sensitive sheet with an image recorded thereon for transferring the image from said photosensitive pressure-sensitive sheet to said developer sheet in a developing unit in an image recording apparatus.

U.S. Pat. No. 4,399,209, for example, discloses an imaging system in which a photosensitive pressure-sensitive sheet exposed to light bearing an image and a developer sheet are superposed on each other and pressed together to develop the image on the developer sheet. Some image output apparatus incorporating such an imaging system have already been proposed. Such an image output apparatus generally employs a roll of photosensitive pressure-sensitive sheet and a cut developer sheet. It has been necessary in the image output apparatus to control the timing of starting to feed the developer sheet so that the developer sheet will be brought into exact registry with a desired position on the photosensitive pressure-sensitive sheet. Heretofore, a complex and highly sophisticated control unit has been required to control the timing of starting to feed the developer sheet for registry with the photosensitive pressure-sensitive sheet.

Some conventional sheet feeding devices in image recording apparatus include a pair of gripper rollers which are either spaced by a fixed gap from each other or in contact with each other. The gripper rollers themselves serve as a stopper for temporarily stopping the sheet feeding by the abutment of the leading edge of the sheet thereagainst. For feeding a sheet such as a developer sheet with the gripper rollers, the gripper rollers start rotating to feed the sheet upon elapse of a preset time after a switch positioned in front of the gripper rollers is pushed. If, however, the sheet is not accurately in abutment with the gripper rollers, the sheet will not be fed by the gripper rollers. If the sheet as it engages the gripper rollers is skeWed with respect to the gripper rollers, the sheet will be fed in a slanting manner relative to a sheet path.

SUMMARY OF THE INVENTION

It is an object of the present invention to provide a method of feeding a sheet so as to be reliably superposed in position on another sheet in an image recording apparatus.

Another object of the present invention is to provide a device for feeding a sheet reliably in a straight manner so as to be superposed in position on another sheet in an image recording apparatus.

Still another object of the invention is to provide an improved method and device which eliminates complete sheet guide extending up to a pressure developing unit, to thereby simplify overall construction.

According to the present invention, there is provided a method of feeding an image recording sheet so as to overlap the image recording sheet with a light-exposed sheet which carries a latent image formed at an exposure unit for transferring the image from the exposed sheet to the image recording sheet in a developing unit. The method comprises the steps of feeding the light exposed sheet into the developing unit; and delivering the image recording sheet to cause a leading end thereof to abut the light-exposed sheet at a position near an inlet of the developing unit for allowing the image recording sheet to move along and with the light-exposed sheet into the developing unit; the delivering step being performed synchronous with the feeding step.

The image recording sheet is delivered so that its leading end abuts the light-exposed sheet. When the leading end of the image recording sheet hits the exposed sheet, the image recording sheet is fed along and with the exposed sheet into the developing unit. The image recording sheet can be superposed properly in position on the exposed sheet by suitably releasing the image recording sheet for delivery toward the exposed sheet.

According to the present invention, there is also provided a device for feeding an image recording sheet so as to overlap the image recording sheet with a light-exposed sheet which carries a latent image recorded thereon in an image recording apparatus. The image recording apparatus includes an exposure unit for light-exposure to the sheet for forming the latent image, and a pressure developing unit disposed at downstream side of the exposure unit at which the light-exposed sheet and the image recording sheet are overlappingly pressed. The sheet feeding device comprises: a stop means for temporarily preventing the image recording sheet from feeding to the developing unit, and driving means for selectively allowing the image recording sheet to pass therethrough in response to movement of the light-exposed sheet.

According to one embodiment of the invention, there is provided a movable feed roller disposed at an upstream side of the stop means. When the feed roller is in the first position, the feed roller is retracted in a sheet guide, and the image recording sheet can be Inserted until its leading end abuts the stopper. Therefore, the image recording sheet can be reliably set with respect to the stopper and be suitably directed without being skewed. When the feed roller is in the second position, it displaces the image recording sheet so that its leading end is disengaged from the stopper. The image recording sheet can thus be fed in a straight fashion toward the exposed sheet in response to rotation of the feed roller.

The above and other objects, features and advantages of the present invention will become more apparent from the following description When taken in conjunction with the accompanying drawings in which a preferred embodiment of the present invention is shown by way of illustrative example.

DESCRIPTION OF THE PREFERRED EMBODIMENT

Figure 1:
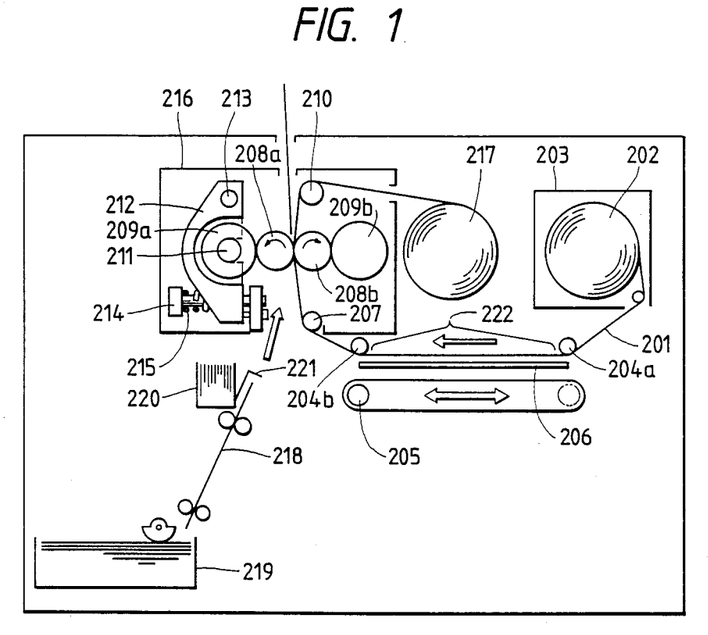
FIG. 1 is a schematic vertical cross sectional view showing an image recording apparatus employing a method of feeding a sheet according to the present invention.

FIG. 1 shows an image output or image recording apparatus employing a sheet feeding method according to the present invention. The image recording apparatus houses therein a sheet like photosensitive pressure-sensitive recording medium 201 (hereinafter referred to as a "photosensitive pressure-sensitive sheet") stored as a sheet supply roll 202 in a sheet storage cassette 203. The photosensitive pressure-sensitive sheet may be a color imaging sheet disclosed in U.S. Pat. No. 4,399,209. The photosensitive pressure-sensitive sheet 201 unreeled from the sheet supply roll 202 is guided by a pair of spaced guide rollers 204a, 204b and then directed by an inlet roller 207 to pass between a pair of pressure developing rollers 208a, 208b, after which the sheet 201 is delivered around a separator or sheet feed roller 210 and wound around a takeup roll 217. Between the guide rollers 204a, 204b, there is disposed an exposure unit 222 in which an original 206 to be imaged is placed underneath the photosensitive pressure-sensitive sheet 201. The exposure unit 222 has a light source 205 such as a fluorescent lamp positioned below the photosensitive pressure-sensitive sheet 201 with the original 206 interposed therebetween. If necessary, light filters and a shutter member may be provided.

The pressure developing rollers 208a, 208b are disposed in a pressure developing unit 216 in confronting relation in a horizontal plane. The pressure developing rollers 208a, 208b are associated respectively with backup rollers 209a, 209b positioned behind and held against the rollers 208a, 208b. The backup roller 209a has a roller shaft 211 mounted on a load lever 212. The lever 212 has one end pivotally connected to the casing of the pressure developing unit 216 by a pivot shaft 213, and has another end portion supporting a load adjusting screW 214 with a load spring 215 acting therebetween. The pressure developing roller 208a is therefore normally urged to be pressed against the pressure developing roller 208b under the resiliency of the load spring 214. The pressure applied to the pressure developing roller 208a can be adjusted by turning the screw 214.

A positioning solenoid 220 is disposed below a lefthand portion (as shown) of the pressure developing roller 208a and coupled to a resist or stopper gate 221. The stopper gate 221 is spaced from the pressure developing rollers 208a, 208b by a distance which is equal to the distance between the lefthand end (as shown) of the exposure unit 222 and the pressure developing rollers 208a, 208b. A sheet cassette 219 storing a stack of image recording sheets or developer sheets 218 is disposed below the positioning solenoid 220.

In operation, the photosensitive pressure-sensitive sheet 201 supplied from the sheet storage cassette 203 is set in the exposure unit 222. The original 206 to be imaged is placed beneath the photosensitive pressure-sensitive sheet 201. The fluorescent lamp 205 which is energized is moved to the right toward the righthand end of the exposure unit 222 and then back to the left toward the lefthand end of the exposure unit 222, whereupon the fluorescent lamp 205 is de-energized (the light exposure times, however, may be changeable). Light emitted from the fluorescent lamp 205 passes through the original 206 to expose the photosensitive pressure-sensitive sheet 201 in the pattern of an image carried by the original 206 for thereby recording a latent image on the sheet 201. After the exposure, the photosensitive pressure-sensitive sheet 201 is fed into the pressure developing unit 216, and at the same time a signal is applied to the positioning solenoid 220 to open the stopper gate 221, thus allowing the developer sheet 218 to be fed into the pressure developing unit 216 at the same speed as that of travel of the photosensitive pressure-sensitive sheet 201. The leading end of the developer sheet 218 first abuts the photosensitive pressure-sensitive sheet 201, and is then guided to move along and with the sheet 201 at an area defined between the inlet roller 207 and the pressure developing rollers 208a, 208b. The developer sheet 218 and the photosensitive pressure-sensitive sheet 201 are superposed on each other and gripped between the pressure developing rollers 208a, 208b. The pressure developing rollers 208a, 208b press the sheets 218, 201 to rupture those microcapsules on the sheet 201 which are not be photocured in the exposure unit 222, for thereby releasing the chromogenic material or dye precursor that reacts with the color developers on the sheet 218 to develop an image on the sheet 218. After leaving the pressure developing rollers 208a, 208b, the photosensitive pressure-sensitive sheet 201 is separated from the developer sheet 218 by the sheet feed roller 210 and then wound on the takeup roll 217. The developer sheet 218 is discharged from the image recording apparatus.

A photosensitive pressure-sensitive sheet used as a photosensitive recording medium in an image recording apparatus including a sheet feeding device according to the present invention may be a color imaging sheet disclosed in U.S. Pat. No. 4,399,209, as described above. If another photosensitive recording medium is employed, the image recording apparatus should have a thermal image-fixing unit at a downstream side of the pressure/developing unit, but may employ the same exposure unit as that used for exposing the imaging sheet disclosed in the above U.S. patent. Further, in the above-described embodiment, the original is closely positioned to the light source to allow light to path therethrough. However, other types of exposure system are also available such as transmittive imaging and light reflection type exposure. Furthermore, the pressure rollers can be obliquely disposed, and a plurality of back-up rollers are applicable. Moreover, a manual sheet insertion is achievable in the invention.

According to this invention described above, it is unnecessary to provide the developer sheet guide which continuously extends from the sheet cassette 219 up to the pressure rollers, yet performing excellent sheet overlapping with the photosensitive/pressure-sensitive sheet. Therefore, compact apparatus results with minimized production cost. Further, because of the feed control of the photosensitive pressure-sensitive sheet and the developer sheet, accurate overlapping therebetween is attainable at an immediately upstream side of the pressure rollers.

Figure 2:
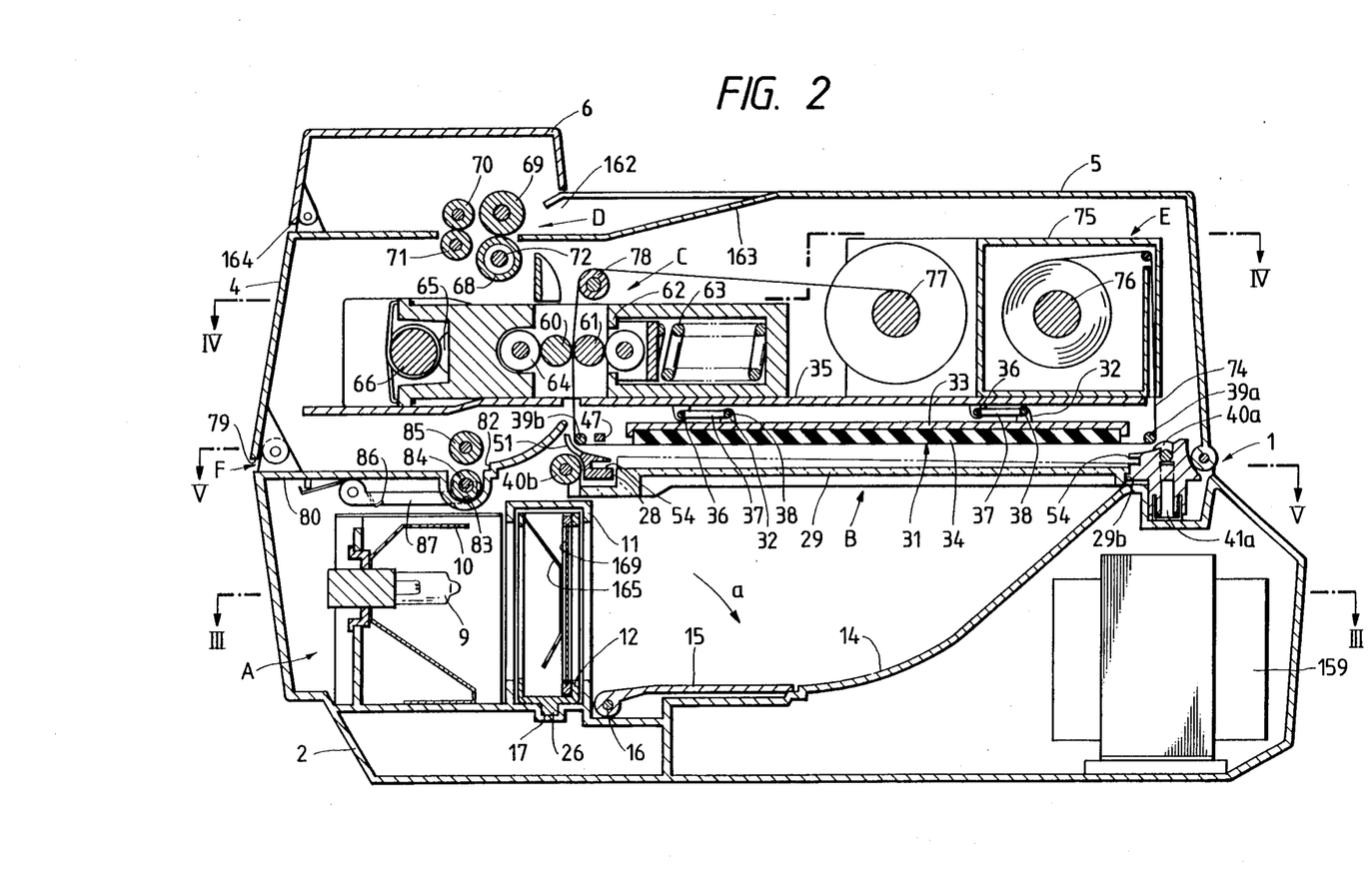
FIG. 2 is a vertical cross-sectional view showing an image recording apparatus incorporating a device for feeding a sheet according to another embodiment of this invention.
Figure 4:
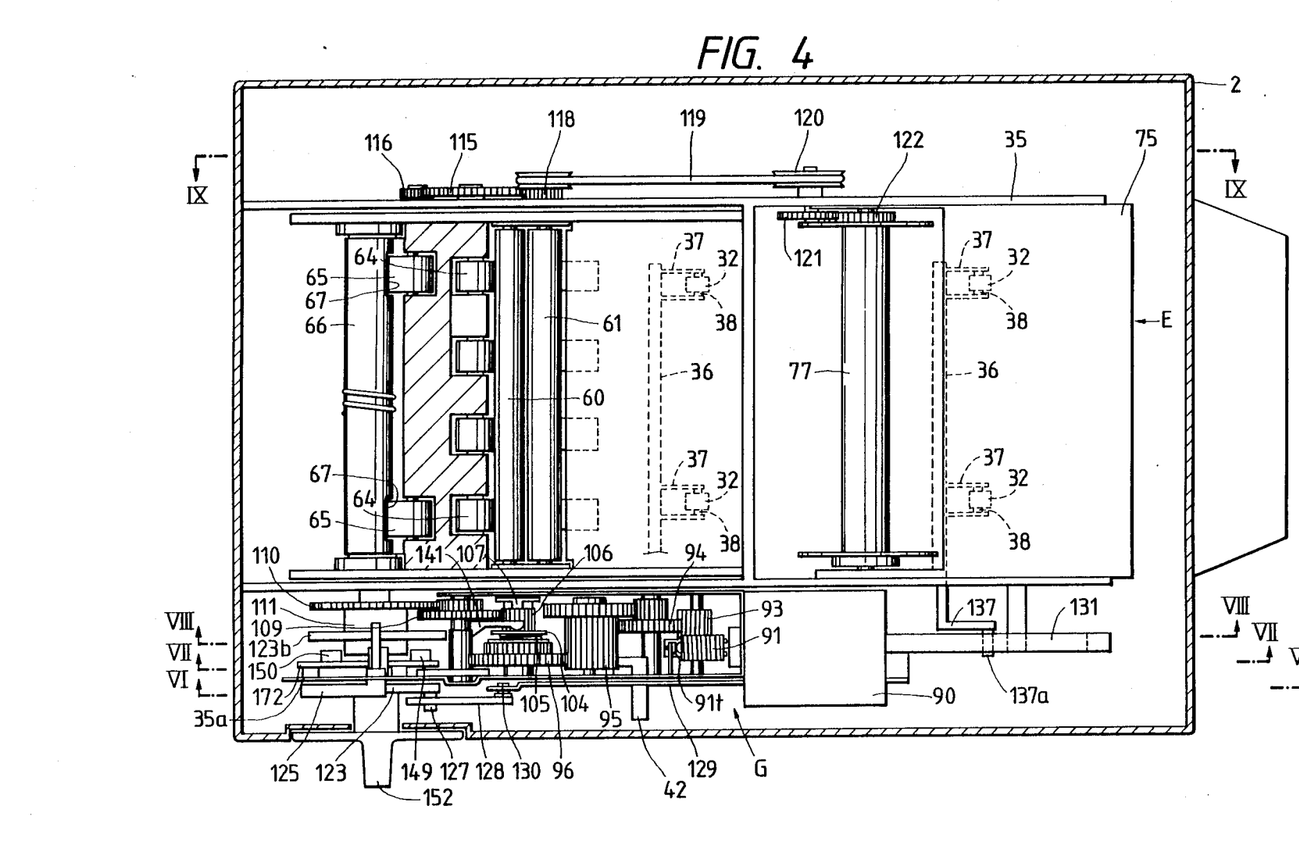
FIG. 4 is a cross sectional view taken along line IV—IV of FIG. 2.

FIG. 2 shows an image recording apparatus according to another embodiment of this invention, and which generally comprises an exposure light source unit A, an exposure unit B, a pressure developing unit C a thermal fixing unit D, a sheet storage cartridge E, a developer sheet insertion unit F, and a driver unit G (FIG. 4). The image recording apparatus has a housing 1 including a lower casing 2 on Which a front cover 4, a rear cover 5, and a frame 35 are openably and closably, i.e., swingably mounted. An upper cover 6 is hinged to the front cover 4 at its upper portion.

Exposure Light Source Unit A

Figure 3:
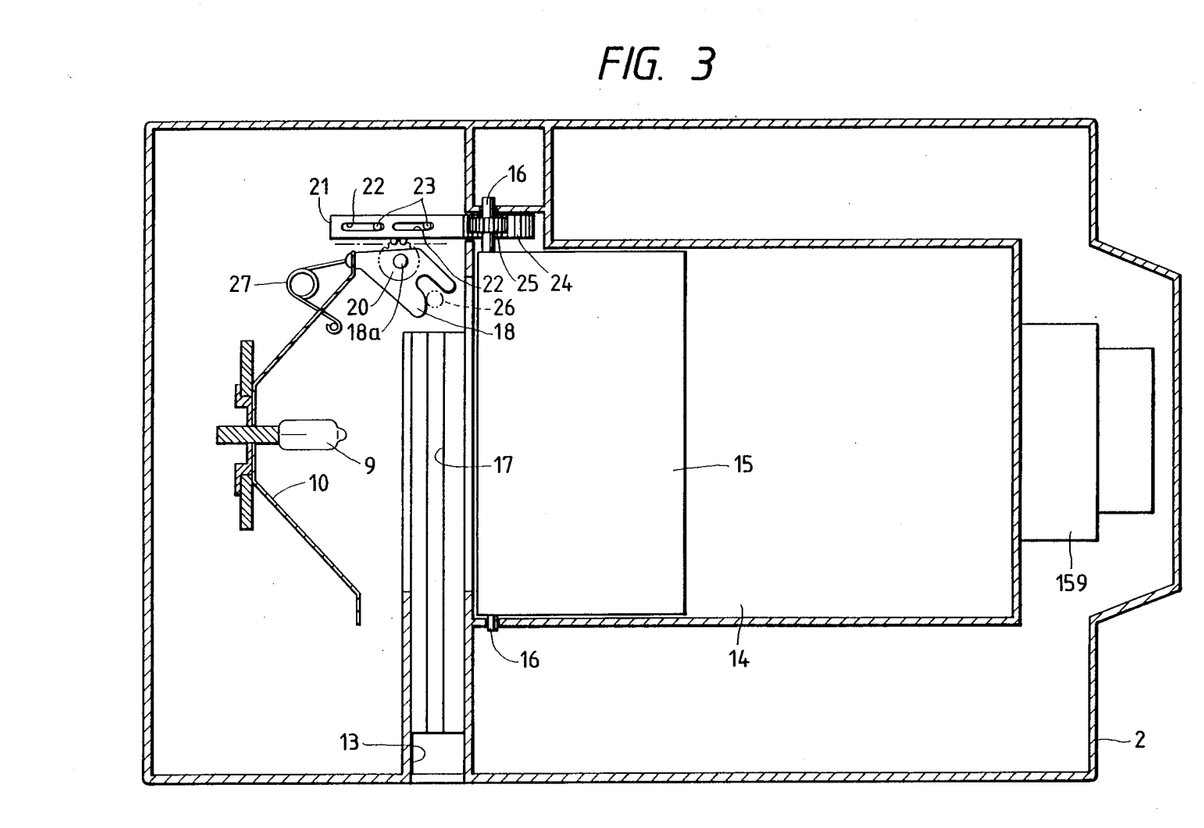
FIG. 3 is a cross-sectional view taken along line III—III of FIG. 2.

As also shown in FIG. 3, the exposure light source unit A comprises a halogen lamp 9 lying horizontally near one side panel of the casing 2, the halogen lamp 9 having its rear and side areas surrounded by a reflector 10. The exposure light source unit A also includes a filter box 11 positioned in front of the halogen lamp 9, and a curved light diffusion plate 14 disposed in front of the filter box 11. A filter case 12 with a color filter 169 mounted therein can be inserted into the filter box 11 through a filter insertion slot 13 (FIG. 3) defined in one side panel of the housing 1. A shutter plate 15 is openably and closably, i.e., swingably mounted In front of the filter box 11.

The shutter plate 15 can be opened and closed by a mechanism as shown in FIG. 3. More specifically, a shutter operating plate 18 is angularly movably mounted on a support shaft 18a on a bottom panel of the casing 2 near the inner end of a groove 17 defined in the bottom of the filter box 11. The shutter operating plate 18 has an integral gear 20 meshing with a rack bar 21 which has a pair of guide slots 22 defined therein. The rack bar 21 is longitudinally movable back and forth in a direction normal to a support shaft 16 of the shutter plate 15, while being guided by pins 23 loosely fitted in the respective slots 22. The rack bar 21 has rack teeth 24 on an upper surface remote from the guide slots 22, the rack teeth 24 meshing with a gear 25 mounted on the support shaft 16. A torsion spring 27 acts between the shutter operating plate 18 and the bottom panel of the casing 2 to click the shutter plate 15 selectively into open and closed positions. When the filter case 12 is not loaded in the filter box 11, the shutter plate 15 is in an upstanding position to close the opening of the filter box 11.

Exposure Unit B

Figure 5:
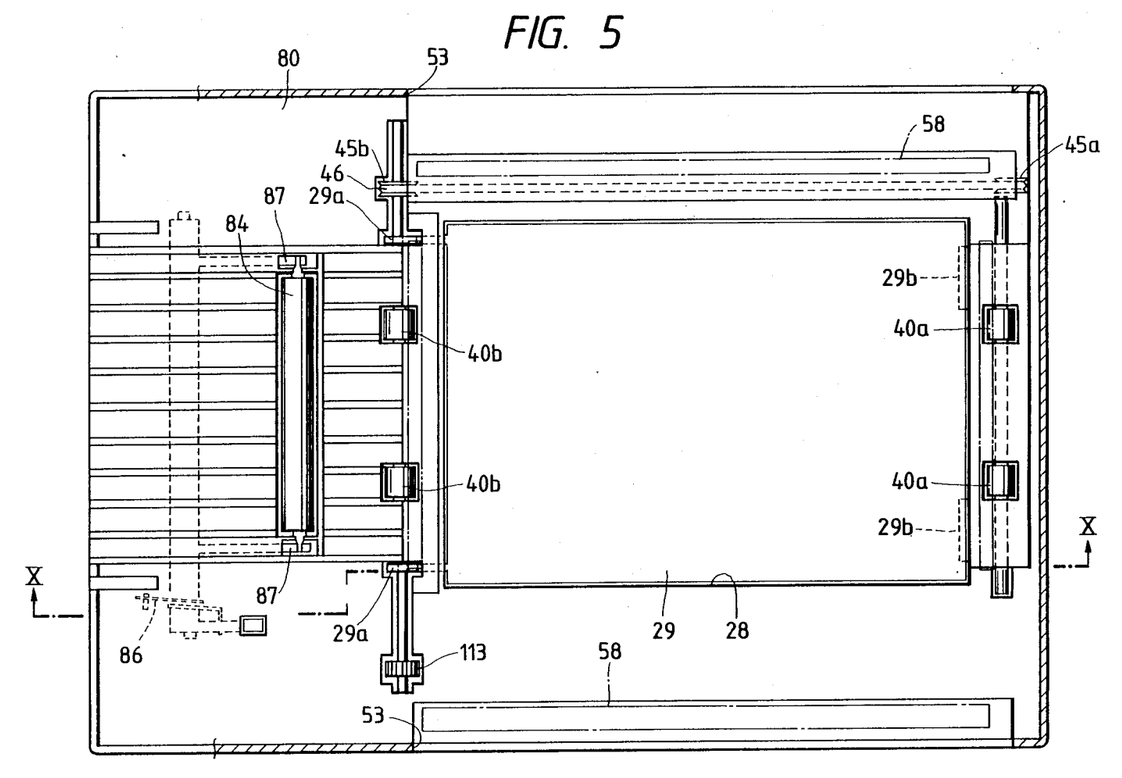
FIG. 5 is a cross sectional view taken along line V—V of FIG. 2.
Figure 10:
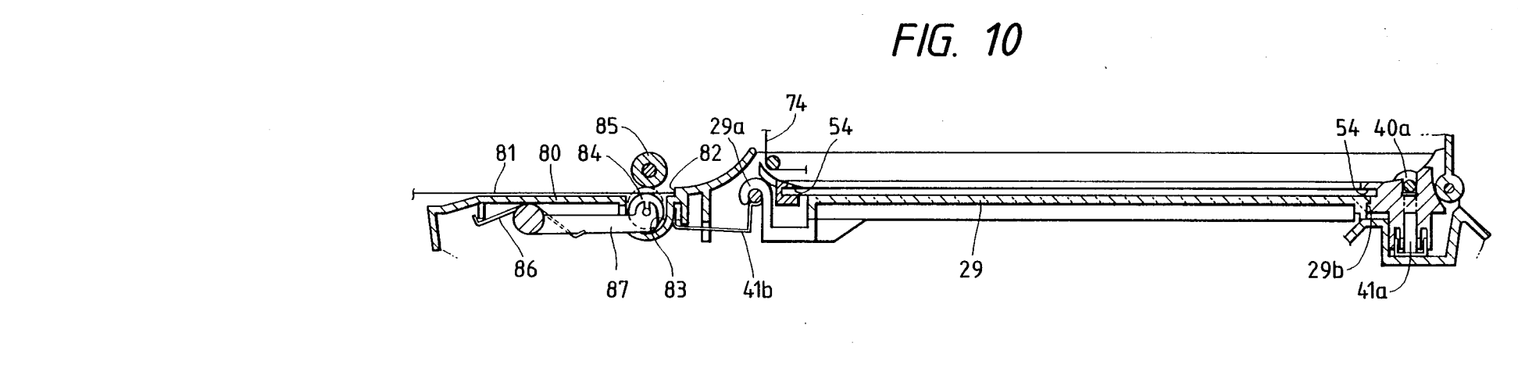
FIG. 10 is a cross-sectional view taken along line X—X of FIG. 5.

The exposure unit B will be described below. As shown in FIGS. 2 and 5, the exposure unit B includes a square frame 28 holding a transparent support body 29, and a presser plate 31 spaced a small gap upwardly from the transparent support body 29. The presser plate 31 comprises an attachment base board 33 and a rubber pressure plate 34 bonded to the lower surface of the base board 33. The square frame 28 is fixed to the casing 2. The transparent support body 29 has hooks 29a (see also FIG. 10) engaging the shaft of load rollers 40b, so that the transparent support body 29 can be angularly moved vertically about bearing plates 29b on the right-hand end of the support body 29 within the square frame 28 in response to vertical movement of the load rollers 40b. The presser plate 31 is suspended from the lower surface of the frame 35 angularly movably supported on the casing 2, by means of shafts 36 mounted on the lower surface of the frame 35, swing rods 37 mounted on the ends of the shafts 36 and having engaging pins 38 on their distal ends, and hooks 32 mounted on the upper surface of the attachment base board 33 and holding the engaging pins 38, as also shown in FIG. 4. A light transmissive original table can be inserted through original table insertion slots 53 (FIG. 5) defined in the opposite side panels of the housing 1 into a position between the transparent support body 29 and the presser plate 31. The original table is inserted while being guided by a guide frame 54 (FIG 10).

Figure 6:
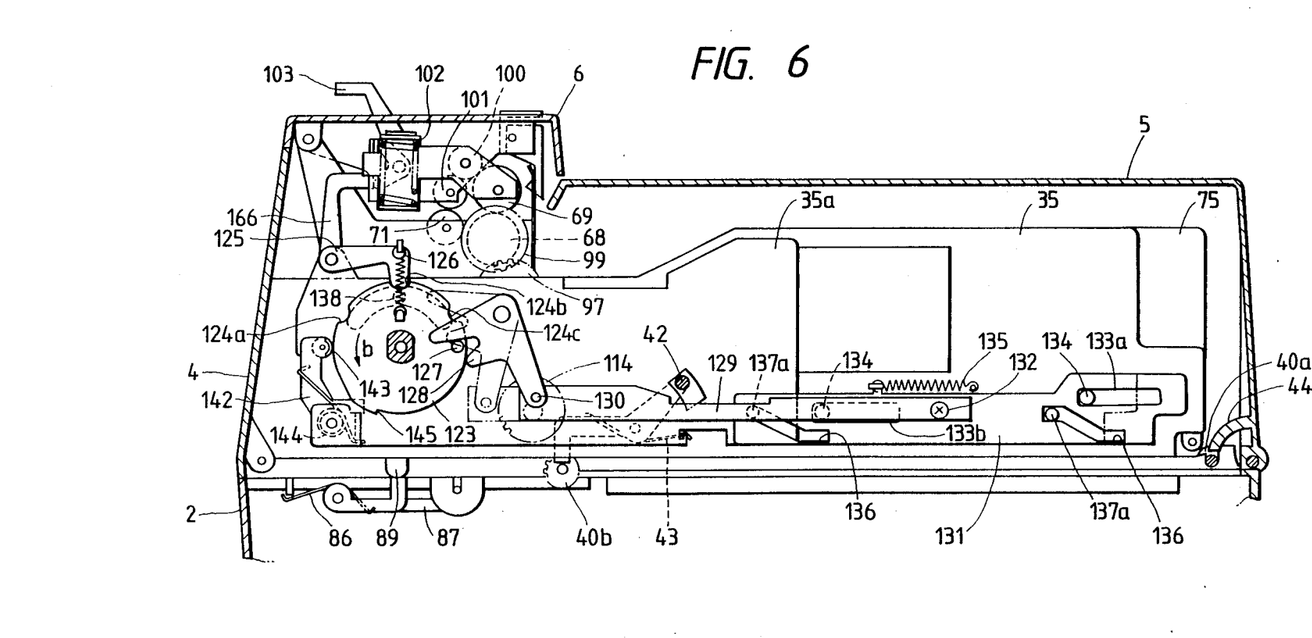
FIG. 6 is a cross-sectional view taken along line VI—VI of FIG. 4.
Figure 7:
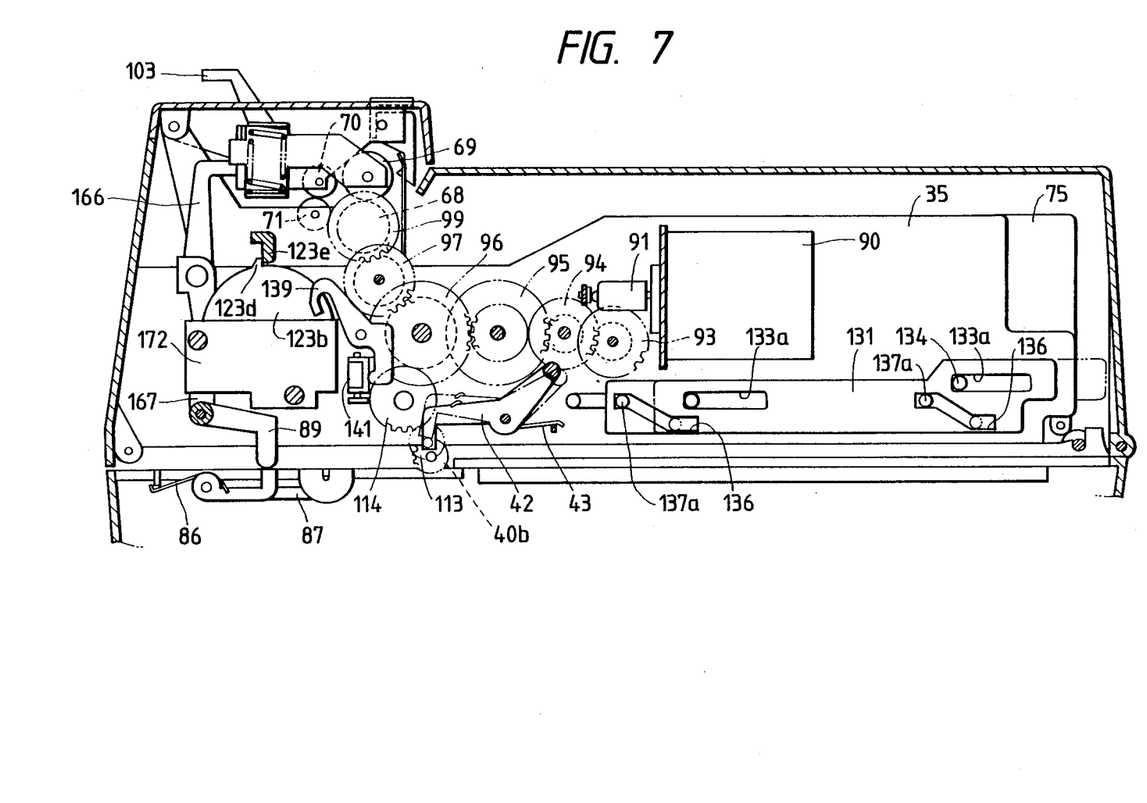
FIG. 7 is a cross-sectional view taken along line VII—VII of FIG. 4.

A photosensitive pressure-sensitive image recording sheet 74 is fed between the original table and the presser plate 31. Guide rollers 39a, 39b are positioned at inlet and outlet ends, respectively, of the exposure unit B, and load rollers 40a, 40b are also positioned at the inlet and outlet ends, respectively, of the exposure unit B. The guide roller 39a and the load rollers 40a are relatively movable toward and away from each other, and similarly the guide roller 39b and the load rollers 40b are relatively movable toward and away from each other. A load belt 46 (FIG. 5) is trained around pulleys 45a, 45b fixedly mounted on the shafts of the load rollers 40a, 40b. As illustrated in FIG. 2, when load rollers 40a, 40b are normally urged to move toward the guide rollers 39a, 39b by load roller springs 41a, 41b (see also FIG. 10). Under normal condition, the opposite end of the shaft of the load rollers 40a are held downwardly by fingers 44 (FIG. 6) projecting from a side panel of the rear cover 5 so that the rollers 40a are spaced from the guide roller 39a. Similarly, one end of the shaft of the load rollers 40b is held downwardly by a finger projecting from an upper panel of the rear cover 5, whereas the other end of the shaft of the load rollers 40b is held downwardly by a sheet feed lever 42 which is supported on a housing panel and resiliently biased by a spring 43 (FIGS. 6 and 7), so that the load rollers 40b are spaced away from the guide roller 39b under normal condition. The sheet feed lever 42 has an end portion projecting out of the housing panel. As shown in FIGS. 5 and 7, a load gear 113 is fixedly mounted on the shaft of the load rollers 40b. The shaft of the load rollers 40b is operatively coupled to a driver source (described later on) through the load gear 113.

An exposure slit lamp tube 47 for re-exposing the photosensitive pressure-sensitive sheet is disposed at the outlet end of the exposure unIt B. A guide member 51 which is also disposed at the outlet end of the exposure unit B is of an arcuate shape for guiding, toward the pressure fixing unit C, the leading end of the photosensitive pressure-sensitive sheet in the form of a roll when it is loaded into the housing 1. As illustrated in FIG. 5, light-shielding rollers 58 are disposed respectively in the original table insertion slots 53 for preventing extraneous light from entering the exposure unit B.

Pressure Developing Unit C

The pressure developing unit C is constructed as follows: The pressure developing unit C has a pair of confronting pressure developing rollers 60, 61 (FIGS. 2 and 4) movable toward and away from each other. The pressure developing roller 61 is resiliently pressed toward stoppers 62 against the resiliency of a spring 63 by the pressure developing roller 60. The pressure developing roller 60 is resiliently pressed against the pressure developing roller 61 by backup rollers 64, cam follower rollers 65, and a cam roller 66. The cam roller 66 has cam slots 67 defined in a peripheral surface thereof. When the cam follower rollers 65 are positioned in the respective cam slots 67, the pressure developing rollers 60, 61 are released of pressed contact with each other. When the cam roller 66 is rotated about its own axis to cause its circular peripheral surface to engage the cam follower rollers 65, the pressure developing roller 60 is pressed against the pressure developing roller 61. While the cam roller 66 makes one revolution about its own axis, the photosensitive pressure-sensitive sheet 74 is fed along by one image-wise length while being gripped between the pressure developing rollers 60, 61.

A mechanism for driving the pressure developing unit C will be described later on.

Thermal Fixing Unit D

As shown in FIG. 2, the thermal fixing unit D comprises a pair of thermal fixing rollers 68, 69 and a pair of discharge rollers 70, 71 disposed downstream of the thermal fixing rollers 68, 69 in the direction in which a sheet is discharged from the thermal fixing unit D. The thermal fixing roller 68 houses a roller heating heater 72, the temperature of which is controlled by a temperature signal detected by a thermistor (not shown) attached to the peripheral surface of the thermal fixing roller 68.

Sheet Storage Cartridge Unit E

The sheet storage cartridge E will be described below. The sheet storage cartridge E includes a sheet storage cassette 75 housing therein a supply roller 76 supporting a roll of the photosensitive pressure-sensitive sheet 74 and a takeup roller 77 for winding the photosensitive pressure-sensitive sheet 74 thereon. The sheet storage cartridge E is driven by a mechanism described later on. The photosensitive pressure-sensitive sheet 74 is fed from the supply roller 76 to the takeup roller 77 as follows: The sheet 74 that is unwound from the supply roller 76 passes between the guide roller 39a and the load roller 40a into a position between the presser plate 31 and the original table in the exposure unit B. Thereafter, the sheet 74 passes through the guide roller 39b and the load roller 40b into the pressure developing unit C where the sheet 74 is gripped between the pressure developing rollers 60, 61. Then, the sheet 74 discharged from the pressure developing unit C runs around a sheet feed roller 78 and is wound on the takeup roller 77. The amount by which the sheet 74 is fed is controlled by the sheet feed roller 78 in a manner described later on.

Developer Sheet Insertion Unit F

The developer sheet insertion unit F includes a developer sheet insertion slot 79 defined between the front cover 4 and the casing 2 and a sheet guide plate 80 on top of the casing and beneath the developer sheet insertion slot 79. The sheet guide plate 80 has a stopper 82 at its inner portion for temporarily engaging and holding the leading end of a developer sheet 81, as shown in FIG. 10, which is inserted through the insertion slot 79, the stopper 82 being in the form of a vertical wall surface. The sheet guide plate 80 includes a curved portion disposed inwardly of the stopper 83 and directed toward the inlet side of the pressure developing rollers 60, 61. The sheet guide plate 80 has a downward cavity 83 which normally accommodates therein a feed roller 84 that is movable into and out of the cavity 83. The feed roller 84, when it is moved out of the cavity 83, can engage a pinch roller 85 disposed upwardly of the feed roller 84. The feed roller 84 is rotatably supported at its opposite ends on the distal ends of support bars 87 (see FIGS. 2 and 5) which are normally urged by a spring 86 to turn counterclockwise (FIG. 2) to move the feed roller 84 upwardly toward the pinch roller 85. The support bars 87 are usually held down by a release arm 89 (FIGS. 6 through 8) to keep the feed roller 84 away from the pinch roller 85 against the resiliency of the spring 86. The stopper 82 and the vertically movable feed roller 84 correspond to the stopper gate 221 and the solenoid 220 in the first embodiment. A mechanism for driving the feed roller 84 will be described later on.

Driver Unit G

The driver unit G will be described below. The driver unit G has a mechanism for driving the exposure light source unit A, the exposure unit B, the pressure developing unit C, the thermal fixing unit D, the sheet storage cartridge E, and the developer sheet insertion unit F, as described above, in a mutually interlinked fashion.

Figure 8:
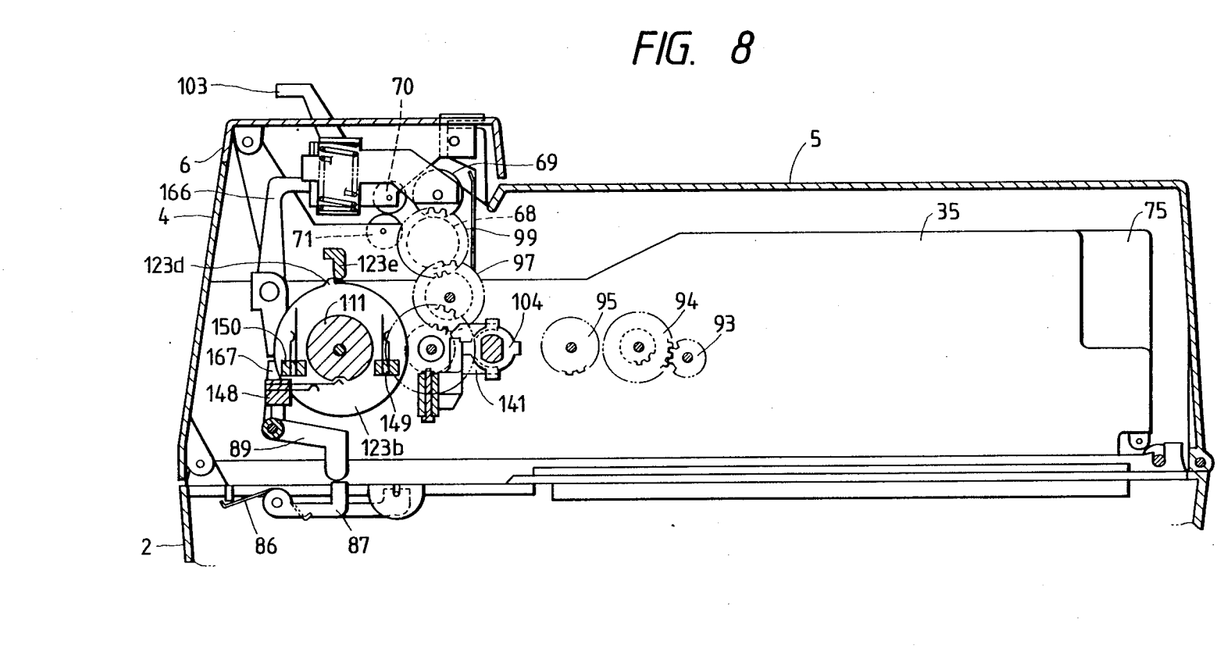
FIG. 8 is a cross-sectional view taken along line VIII—VIII of FIG. 4.

The driver unit G is operably interconnected to the thermal fixing unit D as follows;

As shown in FIGS. 4, 7, and 8, the driver unit G includes a drive motor 90 having a drive shaft on which a worm 91 is mounted. The worm 91 has its distal end held against a thrust bearing member 91t and is held in mesh with a helical gear 93 (FIGS. 7 and 8) that is operatively coupled through successive driven gears 94, 96, 96 to a thermal fixing unit driver gear 97. The thermal fixing unit driver gear 97 is held in mesh with a driven gear 99 mounted on an end of the shaft of the thermal fixing roller 68. As shown in FIG. 6, The shaft of the thermal fixing roller 69 supports on one end thereof a gear meshing through an idle gear 100 with a feed roller driver gear 101 mounted on one end of the feed roller 70. The thermal fixing roller 69 and the feed roller 70 are normally pressed against the thermal fixing roller 68 and the feed roller 71, respectively, under the resilient force of a pressing spring 102, which can be adjusted by a lamination switching lever 103 (described later in detailwith reference to FIG. 6).

Figure 9:
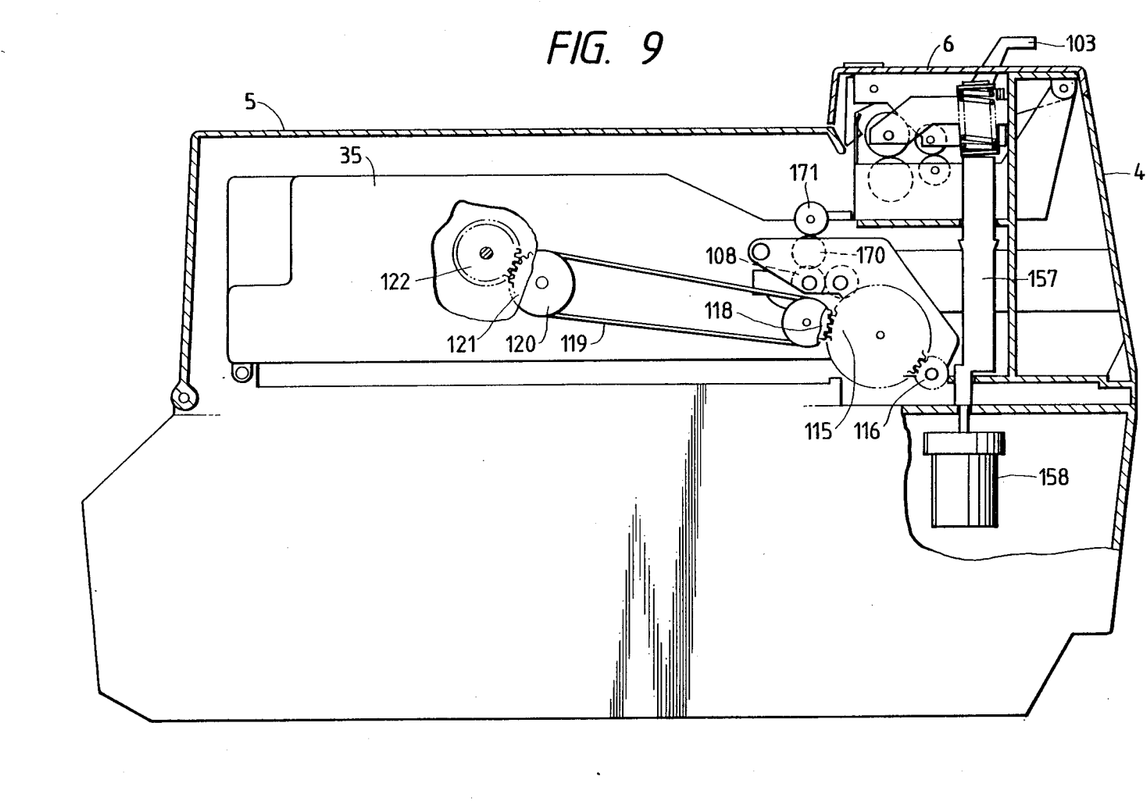
FIG. 9 is a cross-sectional view taken along line IX—IX of FIG. 4.

Mechanical interlinkage of the driver unit G with respect to the pressure developing unit C, the sheet storage cartridge unit E and the developer sheet insertion unit F will next be described. As shown in FIG. 4, on the shaft of the driven gear 96, there is mounted a clutch disc 104 that is engageable with and disengageable from the driver gear 96 through a clutch spring 105. A coupler gear 106 mounted on the shaft of the driven gear 96 is coupled through a coupler 107 to a driver gear 108 (FIG. 9) on the pressure developing roller 60. The coupler gear 106 is held in mesh with the cam roller 66 through an idle gear 109 and a cam gear 110 (FIG. 3). As shown in FIG. 9, the driver gear 108 connected to the roller 61 is held in mesh through an idle gear 170 with a roll gear 171 on the sheet feed roller 78.

In FIG. 7, the driven gear 96 meshes with a load idle gear 114, and a load gear 113 mounted on the load roller 40b at the outlet of the exposure unit B can be moved into mesh with the load idle gear 114 by the sheet feed lever 42.

In FIGS. 4 and 9, the rotative power from the driven gear 108 is transmitted through a pulley gear 118, a supply idle gear 115, and a supply gear 116 to the developer sheet feed roller 84. Further, the rotative power from the pulley gear 118 is also transmitted through a belt 119 to a core pulley 120 and then from a core gear 121 on the shaft of the core pulley 120 to a flange gear 122 fixed to an end of the shaft of the takeup roller 77 in the sheet storage cassette 75. The pulley coupled to the pulley gear 118 and the core pulley 120 have diameters selected such that the rate at which the sheet 74 is wound on the takeup roller 77 is greater than the rate at which the sheet 74 is fed by the sheet feed roller 78.

Next, mechanical interlinkage of the driver unit G with respect to the exposure unit B and the developer sheet insertion unit F will be described. The frame 35 includes a frame portion 35a (FIG. 6) on which a substantially disc-shaped rotatable cam plate 123 is mounted on its front surface by a shaft. The cam plate 123 has three recesses 124a, 124b, 124c defined in the peripheral edge thereof. A lever stopper 125 which is selectively engageable in the recesses 124a, 124b, 124c is pivotally supported on the frame portion 35a. The lever stopper 125 is normally urged toward the peripheral surface of the cam plate 123 by a spring 126. Under normal condition, the lever stopper 125 engages in the recess 124b. A boss 127 projects on the front surface of the cam plate 123, and an end of an operating arm 128 mounted on the frame portion 35a is disengageably held in engagement with the boss 127. To the other end of the operating arm 128, there is coupled a front end of an elongate operating plate 129 by a pin 130. An operating lever 131 is connected to the opposite rear end of the operating plate 129 by a screw 132. The operating lever 131 has two slots 133a, 133b defined longitudinally therein and in which pins 134 projecting from the frame portion 35a are loosely inserted therein, respectively. The operating lever 131 is supported horizontally and is normally urged to the left in FIG. 6 by a spring 135. The operating lever 131 also has two cam follower slots 136 defined in its front and rear end portions thereof and inclined downwardly to the right in FIG. 6. Engaging pins 137a on the ends of the swing rods 37 (FIG. 2) mounted on the shafts 36 are loosely inserted in the cam follower slots 137. Another boss 138 (FIG. 7) also projects from the rear surface of the cam plate 123. A clutch lever 139 (FIG. 7) mounted on the rear surface of the frame portion 35a has one end positioned so as to be engageable with the boss 138 and the other end acting on a horizontally rotatable operating lever 141 (FIGS. 4, 7, and 8) to cause the clutch disc 104 to engage the driven gear 96 against the resiliency of the clutch disc spring 105.

As illustrated in FIG. 6, a release lever 142 pivotally mounted on the frame portion 35a supports on its distal end a release roller 143 pressed against the peripheral edge of the cam plate 123 by a release spring 144. The release arm 89 interlinked with the sheet feed roller 84 is operatively coupled by a clutch mechanism to the shaft on which the release lever 142 is mounted. The cam plate 123 has a projection 145 on its peripheral edge for engaging the release roller 143 to push back the release lever 142 (counterclockwise in FIG. 6).

As shown in FIGS. 4 and 8, a cam revolution detector switch 148 which is turned on when the cam roller 66 makes one revolution, a re-exposure on/off switch 149 for turning on and off the exposure slit lamp tube 47, and a switch 150 for turning on and off the halogen lamp 9 are mounted on a circuit board 172. A cam plate 123b and a cam 111 are mounted on an end of the shaft of the cam roller 66. In FIGS. 7 and 8, the cam plate 123b has on its peripheral edge a projection 123d with which is engageable a stop lever 123e integrally formed with the lever stopper 125. The cam 111 is positioned in engagement with the cam revolution detector switch 148. As shown in FIG. 4, an operating lever 152 for operating the cam plate 123 is mounted on the end of the shaft of the cam plate 123 which projects from the housing 1.

Other accessory devices of the image recording apparatus will be described below. A vertically movable switch lever 157 (FIG. 9) is supported on the frame 35 and has a lower end positioned in confronting relation to a switch 158 (FIG. 9) which serves to selectively turn on and off a main power supply fixedly mounted in the casing 2.

As shown in FIGS. 2 and 3, a transformer 159 is disposed in the casing 2 behind the light diffusion plate 14. In FIGS. 6 through 8, the lamination switch lever 103 is angularly movably mounted in the front cover 4, and a lamination lever 166 is also disposed in the front cover 4 in contact with one end of the lamination switching lever 103. A release sublever 167 is positioned beneath the lower end of the lamination lever 166 and held in engagement with the release arm 89. The front cover 4 has a film insertion slot 162 (FIG. 2) for inserting a film to be laminated therethrough. The rear cover 5 has a film guide passage 163 defined in its upper panel and extending through the film insertion slot 162 toward the thermal fixing rollers 68, 69.

Operation of the image recording apparatus is as follows: When the power supply of the image recording apparatus is switched on, the motor 90 (FIG. 4) is rotated at a speed lower than that for a pressure fixing mode of operation, and the heater 72 in the thermal fixing roller 68 is energized. It is assumed here that, at first, the operating lever 152 is in a neutral position and the lamination switching lever 103 is in a thermal fixing position. Rotative drive power from the motor 90 is transmitted through the gears 94 through 101 to the thermal fixing rollers 68, 69 and the feed rollers 70, 71 to rotate them. When the heater 72 reaches a preset temperature, a ready lamp is energized. Then, or before the ready lamp is energized, an original is set on the original table and inserted into the housing 1, and the filter case 12 with the color filter 159 mounted therein is inserted into the filter box 11. A pin 26 projecting downwardly from the bottom of the filter case 12 engages the operating plate 18 (FIG. 3) to rotate the gear 20 for thereby retracting the rack bar 21. Therefore, the gear 25 is rotated to turn the shutter plate 15 in the direction of the arrow a in FIG. 2, thus opening the front side of the filter box 11. Thereafter, the operating lever 152 is turned counterclockwise in the direction of the arrow b in FIG. 6 for an exposure mode until the lever stopper 125 fits in the recess 124c in the cam plate 128. The operating arm 128 is turned by the boss 127 to move the operating lever plate 131 forwardly for lowering the presser plate to bring the photosensitive pressure-sensitive sheet 74 into intimate contact with the original on the transparent support body 29. At this time, the photosensitive pressure-sensitive sheet 74 is not frictionally abraded by the rubber pressure plate 34 since the presser plate 31 moves in an arcuate path. By further turning the operating lever 152 in the direction of the arrow b, the boss 138 on the cam plate 123 pushes the switch 150 (FIG. 8) for energizing the halogen lamp 9. Light emitted from the halogen lamp passes through the color filter 169, is diffused by the light diffusion plate 14, and then applied through the transparent support body 29 to the original. The light which has passed through the original illuminates the photosensitive pressure-sensitive sheet 74. For making an exposure twice, the operating lever 152 is returned to the neutral position, the original table is replaced with another original table, and the operating lever 152 is turned for the exposure mode.

Figure 11:
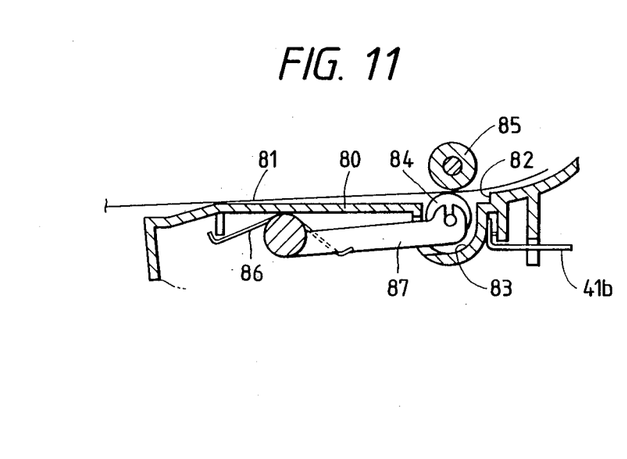
FIG. 11 is a fragmentary cross sectional view showing operation of the sheet feeding device of the invention.

After the exposure, a developer sheet 81 (FIG. 10) is inserted through the insertion slot along the guide plate 80 until it engages and is stopped by the stopper 82. After the developer sheet 81 has been inserted, the operating lever 152 is turned clockwise in the direction opposite to the direction b (FIG. 6) until the lever stopper 125 fits into the recess 124a in the cam plate 123. The clutch lever 139 is then turned by engagement with the boss 138 to rotate the operating lever 141 horizontally, whereupon the clutch disc 104 is coupled to the driven gear 96 to transmit the rotative power of the motor 90 to the pressure developing rollers 60, 61. At the same time, the release lever 142 is retracted by being pushed by the projection 145 on the cam plate 123. The release arm 89 is now turned upwardly to allow the the sheet feed roller 84 to be elevated from the position of FIG. 10 to the position of FIG. 11 for thereby releasing the leading end of the developer sheet 81 from the stopper 82. The developer sheet 81 is gripped between the pinch roller 85 and the sheet feed roller 84, and the sheet feed roller 84 is driven by the motor power transmitted through the driven gear 96, the coupler gear 106, the supply idle gear 115, and the supply gear 116 to deliver the developer sheet 81 between the pressure developing rollers 60, 61. The developer sheet 81 first advances until its leading end abuts the photosensitive pressure-sensitive sheet 74, and is then moved along the sheet 74 into the pressure developing unit C. At this time, the photosensitive pressure-sensitive sheet 74 is also fed by the sheet feed roller 78 driven by the driver gear 108, the idle gear 170, and the roll gear 171 and is wound on the takeup roller 77 in synchronism with the delivery of the developer sheet 81. The cam plate 123b is also rotated by the gears 106, 109, 110 to turn on the switch 149 for thereby energizing the exposure slit lamp tube 47. At the same time, the cam roller 66 is caused by the gears 106, 109, 110 to make one revolution to enable the pressure developing roller 60 to press the photosensitive pressure-sensitive sheet 74 against the pressure developing roller 61 with the developer sheet 81 overlapping the exposed surface of the sheet 74. Therefore, the sheets 74, 81 as they are superposed on each other are passed between and pressed together by the pressure developing rollers 60, 61. Those microcapsules which are not photo-cured on the exposed surface of the sheet 74 are ruptured under pressure to release the dye precursor which reacts with the color developers on the developer sheet 81, thereby developing an image on the sheet 81. After the image has been developed under pressure, the developer sheet 81 is fed between the thermal fixing rollers 68, 69. The photosensitive pressure-sensitive sheet 74 as it leaves the pressure developing unit C is fed by the sheet feed roller 78 and Wound by the takeup roller 77. At this time, the photosensitive pressure-sensitive sheet 74 is prevented from being slackened since the diameter of the pulley of the pulley gear 118 (FIG. 4) and the diameter of the core pulley 120 (FIG. 4) are selected such that the the takeup roller 77 winds the sheet 74 at a rate greater than the rate at which the sheet 74 is fed by the sheet feed roller 78. One cycle of the above pressure developing process is in synchronism with one revolution of the cam rollower 66. Therefore, one pressure developing cycle is finished when the rollers 65 enter the cam slots 67. At the same time that the pressure developing cycle is completed, the stop lever 123e is lifted by the projection 123d on the cam plate 123b to elevate the lever stopper 125, whereupon the cam plate 123 is returned to the neutral position. Concurrent with this, the clutch disc 104 is disconnected from the driven gear 96. The switch 148 (FIG. 8) is turned off as it engages in a cam recess in the cam 111. When the switch 148 is turned off, the voltage applied to the motor 90 is lowered to increase the service life of the motor 90.

The developer sheet 81 which has entered the thermal fixing unit D is heated by and between the thermal fixing rollers 68, 69 for color development. The temperature of the developer sheet 81 is then lowered while the sheet 81 is being pulled by the feed rollers 70, 71 and straightened thereby so that the sheet 81 will not be curled. Then, the sheet 81 is discharged from an outlet slot 164 defined between the front cover 4 and the upper cover 6.

For laminating the developer sheet 81 with a transparent film, the lamination switching lever 103 (FIGS. 6 and 7) is turned to turn the lamination lever 166 to thereby lower the release arm 89 and the sheet feed roller 84. The developer sheet 81 therefore cannot be fed into the housing 1 from the insertion slot 79. When the lamination switching lever 103 is turned, the pressing spring 102 is compressed to press the thermal fixing roller 69 more strongly against the thermal fixing roller 68. Then, an image, particularly one on a developer sheet 81 or any other picture, is sandwiched between lamination sheets, and inserted between the thermal fixing rollers 68, 69 by which the sheets are fused with heat. If the developer sheet 81 or the like is jammed in the thermal fixing unit D, then the upper cover 6 is opened, and the thermal fixing roller 69 and the feed roller 70 are lifted to remove the jammed sheet. In this instance, gears 99 and 97 are slippingly rotated so as to prevent the motor 90 from application of overloading.

According to the second embodiment of the invention, the developer sheet can be manually inserted up to the stopper, and the sheet can be delivered to the pressure developing unit without substantial mechanical guide extending up to the pressure developing unit.

Although certain preferred embodiments have been shown and described, it should be understood that many changes and modifications may be made therein without departing from the spirit and scope of the invention.

What is claimed is:

1. A device for feeding an image recording sheet so as to overlap said image recording sheet with a light-exposed sheet which carries a latent image recorded thereon in an image recording apparatus, said image recording apparatus including an exposure unit for light-exposure to said sheet for forming said latent image; and a pressure developing unit disposed downstream of said exposure unit at which said light-exposed sheet and said image recording sheet are overlappingly pressed; said device for feeding comprising:

stop means for temporarily preventing said image recording sheet from being fed to said developing unit;

driving means for selectively allowing said image recording sheet to pass therethrough in response to movement of said light-exposed sheet; and, a sheet guide for guiding travel of said image recording sheet toward said pressure developing unit, a downstream end of said guide being disposed in a vicinity of an outlet end of said exposure unit, said stop means being disposed at said sheet guide and adapted to abut against a leading edge of said image recording sheet; and a movable roller movably disposed with respect to said sheet guide and positioned at an upstream side of said stop means, said driving means being connected to said movable roller, said movable roller providing a first position for effectuating said stop means to prevent said image recording sheet from moving, and providing a second position for incapacitating said stop means.

2. The device according to claim 1, further comprising a pinch roller, said movable roller being in contact with said pinch roller to grip said image recording sheet therebetween when said movable roller is in said second position.

3. The device according to claim 1, wherein said sheet guide has an upstream end portion contiguous with a manual sheet insertion hole.

4. A device for feeding an image recording sheet so as to overlap said image recording sheet with a light-exposed sheet which carries a latent image recorded thereon in an image recording apparatus, said image recording apparatus including an exposure unit for light-exposure to said sheet for forming said latent image; and a pressure developing unit disposed downstream of said exposure unit at which said light-exposed sheet and said image recording sheet are overlapping pressed; said device for feeding comprising:

stop means for temporarily preventing said image recording sheet from being fed to said developing unit; and driving means for selectively allowing said image recording sheet to pass therethrough in response to movement of said light-exposed sheet;

wherein a length of a sheet path for said image recording sheet from said stop means to said pressure developing unit is equal to a length of a sheet path for said light-exposed sheet from an outlet of said exposure unit to said pressure developing unit.

5. A device for feeding an image recording sheet so as to overlap the image recording sheet with a light-exposed sheet which carries a latent image recorded thereon in an image recording apparatus, the image recording sheet being coated with a developer material and the light-exposed sheet being coated with microcapsules encapsulating therein chromogenic material reactable with the developer material, the image recording apparatus including an exposure unit for light-exposure to the light exposed sheet for forming said latent image; and a pressure developing unit disposed downstream of the exposure unit, light-exposed sheet and the image recordable sheet being overlappingly pressed at the pressure developing unit; the device feeding comprising;

stop means for temporarily preventing said image recording sheet from being fed to said pressure developing unit;

driving means for selectively allowing said image recording sheet to pass through said stop means in response to movement of said light-exposed sheet, said driving means comprising a solenoid connected to said stop means, said solenoid being synchronously actuated in response to movement of said light-exposed sheet for feeding said light-exposed sheet to said pressure developing unit; and, a sheet cassette for storing a stack of said image recording sheets, said stop means temporarily preventing said image recording sheet supplied from said sheet cassette from feeding to said pressure developing unit, said sheet cassette and said pressure developing unit defining a sheet path therebetween on which said image recording sheet is travelled, and said stop means being positioned on said sheet path.

6. The device according to claim 5, wherein said stop means is pivotally movable for selectively blocking a travel of said image recording sheet in response to said solenoid.

* * * * *